(12) United States Patent
Hirata et al.

(10) Patent No.: US 6,960,095 B2
(45) Date of Patent: Nov. 1, 2005

(54) PIN GRID ARRAY SOCKET WITH KICKBACK FORCE RESISTING SLIDE PLATE

(75) Inventors: Toshihisa Hirata, Yamato (JP); Masami Sasao, Kanagawa (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/476,078

(22) PCT Filed: Apr. 25, 2002

(86) PCT No.: PCT/US02/13176
§ 371 (c)(1),
(2), (4) Date: Oct. 24, 2003

(87) PCT Pub. No.: WO02/087292
PCT Pub. Date: Oct. 31, 2002

(65) Prior Publication Data
US 2004/0147155 A1 Jul. 29, 2004

(30) Foreign Application Priority Data
Apr. 25, 2001 (JP) .......................... 2001-127737

(51) Int. Cl.⁷ .......................... H01R 4/50; H01R 13/625

(52) U.S. Cl. ...................................................... 439/342
(58) Field of Search ................................ 439/342, 259, 439/268, 266

(56) References Cited

U.S. PATENT DOCUMENTS

| | | | | |
|---|---|---|---|---|
| 4,836,798 A | * | 6/1989 | Carter | 439/268 |
| 6,210,199 B1 | * | 4/2001 | Walkup et al. | 439/342 |
| 6,254,415 B1 | * | 7/2001 | Mizumura et al. | 439/342 |
| 6,457,986 B2 | * | 10/2002 | Hirata | 439/342 |
| 6,464,525 B2 | * | 10/2002 | Mizumura | 439/342 |

* cited by examiner

*Primary Examiner*—Chandrika Prasad
(74) *Attorney, Agent, or Firm*—Robert J. Zeitler (57) ABSTRACT

Disclosed is an unlocking-proof PGA package socket which is so designed that upon the slide plate being put in its locking position for fastening a PGA package to the socket the longest vector of the circular cam member runs beyond the point of contact at which the cam member is put in contact with the slide plate, thereby allowing the kickback to push the cam member in the direction opposite to the direction in which the cam member turns toward unlocking position.

11 Claims, 8 Drawing Sheets

PRIOR ART

FIG.7 (b)

PRIOR ART

FIG.8 (a)

PRIOR ART

FIG.8 (b)

PRIOR ART

PIN GRID ARRAY SOCKET WITH KICKBACK FORCE RESISTING SLIDE PLATE

FIELD OF THE INVENTION

The present invention relates to a pin grid array package socket which can be used in making a required electric connection between a pin grid array package (hereinafter abbreviated as "PGA package") and an associated electric circuit.

BACKGROUND OF THE INVENTION

A conventional PGA package socket comprises a base housing having a plurality of terminals arranged in the form of a grid and a slide plate having a corresponding plurality of through holes made in the form of a grid. The slide plate is laid on the base housing, and it is movable between the first position in which the lead pins of a PGA package are permitted to be inserted in the terminal mounts in the base housing without substantial force applied to the PGA package and the second position in which the lead pins are put in contact with the terminals mounted in the base housing.

One example of means for moving the slide plate on the base housing comprises a cam axle extending on the rear lateral edge of the base housing and a handle positioned on one side of the base housing, and operatively connected to the cam axle (see Japan Patent Application Laid-Open Nos. 7-142134, 4-319277, 56-125861 and 11-185914). Another example of slide plate driving means comprises a cam member passing through the base housing and the slide plate. The cam member has a recess made in its head for accommodating a screwdriver or a small-sized hexagonal socket wrench. Using such a tool in place of the handle can move the cam member.

Figure 7:
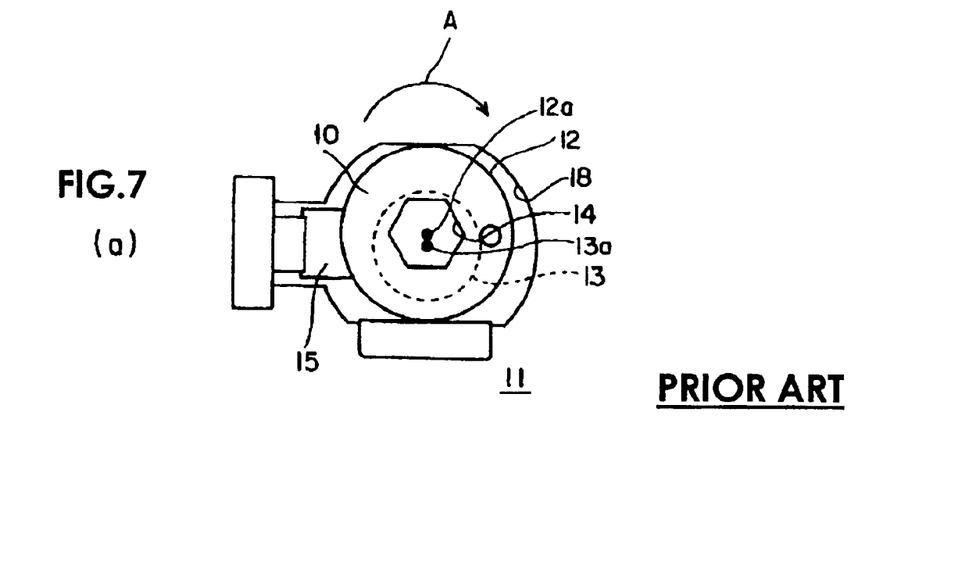

Referring to FIG. 7(a), a PGA package socket has a cam member 10 passing through its base housing and slide plate. The cam member 10 is circular, and its circular outer circumference 12 is put partly in contact with the opposite lateral sides of the cam hole 18 made in the slide plate 11.

The pivot axle (broken lines) 13 of the cam member 10 has its center 13a offset from the center 12a of the circular outer circumference 12 of the cam member 10. A hexagonal socket wrench is inserted in the hexagonal hole 14 of the head of the cam member 10 to be rotated in the direction indicated by arrow A. Then, the situation as shown in FIG. 7(b) is brought about, where the slide plate 11 is moved in the direction as indicated by arrow B.

Specifically the cam member 10 pushes the slide plate 11 by applying the pushing force X to the slide plate 11. When the radial protrusion 15 abuts on the retainer 16, rotation of the cam member 10 stops. In this position the lead pins of the PGA package are put in contact with the terminals of the socket, so that the kickback force Y may be caused from the resultant resilient force of all lead pins as a counter force to the pushing force X (see FIG. 7(b)). The kickback Y increases with the increase of the number of the terminals or the lead pins of the PGA package.

As shown in FIG. 7(b), the pushing force X opposes the kickback Y. For accidental reasons these forces fail to oppose each other, so that the cam member 10 may be rotated in the direction indicated by arrow C. As a result the electric connection between the lead pins of the PGA package and the terminals of the socket is loosened.

Figure 8:
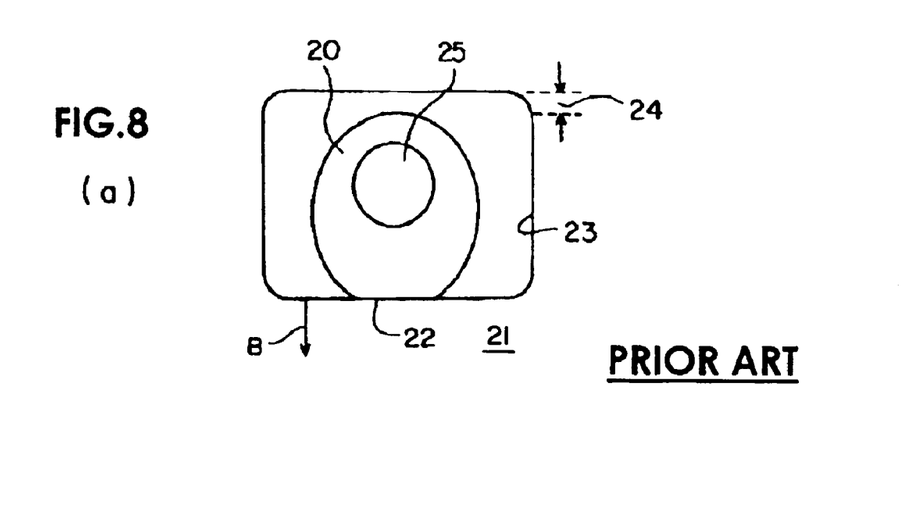

In the hope of solving this problem, as shown in FIG. 8(a), a cam member 20 has a flat 22 chamfered on one side, on which side the cam member 20 pushes the slide plate 21, and is locked in this position. The cam member 20 is not circular, allowing a significant gap to appear between the outer circumference of the cam member 20 and one lateral side of the cam hole 23 in the slide plate 21. Such a significant gap is apt to cause an adverse effect on the function of permitting the force-free insertion of the lead pins of a PGA package in the terminal mounts, since the side plate can move upwardly or downwardly. Still disadvantageously, the curve-to-flat transient or angular corner 22a of the cam member 20 is apt to be badly loaded when the cam member 20 is made to rotate from the unlocking position (FIG. 8(b)) to the locking position (FIG. 8(a)), and the angular corner 22a is apt to be deformed. It means the reduction of lifespan of the cam.

SUMMARY OF THE INVENTION

One object of the present invention is to provide a PGA package socket which can use a circular cam member while at the same time assuring that the circular cam member cannot be displaced toward the unlocked position once it has reached its locked position.

To attain this object a pin grid array package socket comprising a base housing having a plurality of terminals arranged in the form of a grid and a slide plate having a corresponding plurality of through holes made in the form of a grid, the slide plate being laid on the base housing, and being movable between the first position in which the lead pins of a pin grid array package are permitted to be inserted in the terminal mounts in the base housing and the second position in which the lead pins are put in contact with the terminals mounted in the base housing, is improved according to the present invention in that the base housing has a cam member rotatably fitted in the positioning hole made therein in such a way that rotation of the cam member in a predetermined direction may allow the outer periphery of the cam member to push the counter surface of the positioning hole, thereby making the slide plate move to the second position whereupon the longest vector of the cam member is put in an offset position ahead of the contact position at which the outer periphery of the cam member is put in contact with the counter surface of the positioning hole.

The outer periphery of the cam member is circular.

The cam member may be located in a recess of the base housing and have a radial protrusion integrally connected thereto, thereby making the cam member stop by allowing the radial protrusion to be caught by a inner wall of the recess, which is so positioned on the slide plate that the radial protrusion may be caught by the inner wall when the longest vector of the cam member is put in the offset position ahead of the contact position at which the outer periphery of the cam member is put in contact with the counter surface of the positioning hole.

A pin grid array package socket comprising a base housing having a plurality of terminals arranged in the form of a grid and a slide plate having a corresponding plurality of through holes made in the form of a grid, the slide plate being laid on the base housing, and being movable between the first position in which the lead pins of a pin grid array package are permitted to be inserted in the terminal mounts in the base housing and the second position in which the lead pins are put in contact with the terminals mounted in the base housing, is improved according to the present invention in that the base housing has a cam member rotatably fitted in the positioning hole made therein in such a way that rotation of the cam member in a predetermined direction may allow the outer periphery of the cam member to push the counter surface of the positioning hole, thereby making the slide plate move to the second position whereupon the center of the outer periphery of the cam member is displaced an offset distance apart from the center of the pivot axle of the cam member in the predetermined direction.

Other objects, features and advantages of the invention will be apparent from the following detailed description taken in connection with the accompanying drawings.

BRIEF DESCRIPTION OF THE ACCOMPANYING DRAWINGS

The invention, together with its objects and the advantages thereof, may be best understood by reference to the following description taken in conjunction with the accompanying drawings, in which like reference numerals identify like elements in the figures and in which:

FIG. 3(a) is an enlarged plane view of the cam member in its unlocking position whereas FIG. 3(b) is an enlarged plane view of the cam member in its locking position;

FIG. 4(a) is an enlarged bottom view of a cam member according to an embodiment whereas FIG. 4(b) is an enlarged cross-sectional view of X—X line of FIG. 4(a);

FIG. 7(a) is an enlarged plane view of a cam member in its locking position in a conventional PGA package socket whereas FIG. 7(b) is an enlarged plane view of the cam member in its unlocking position; and FIG. 8(a) is an enlarged plane view of a cam member in its locking position in another conventional PGA package socket whereas FIG. 8(b) is an enlarged plane view of the cam member in its unlocking position.

DESCRIPTION OF THE PREFERRED EMBODIMENTS

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 1:
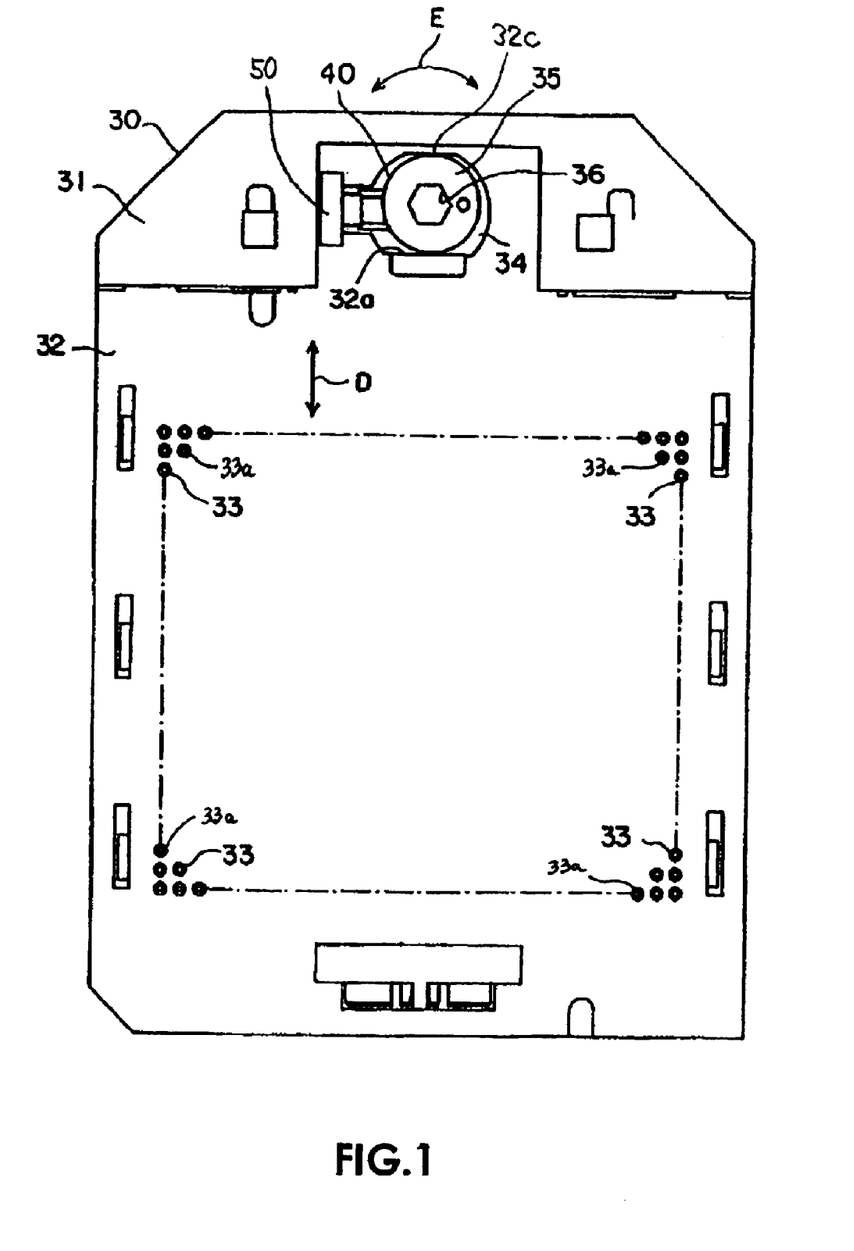
FIG. 1 is a plane view of a PGA package socket according to an embodiment of the present invention in its unlocking position.
Figure 2:
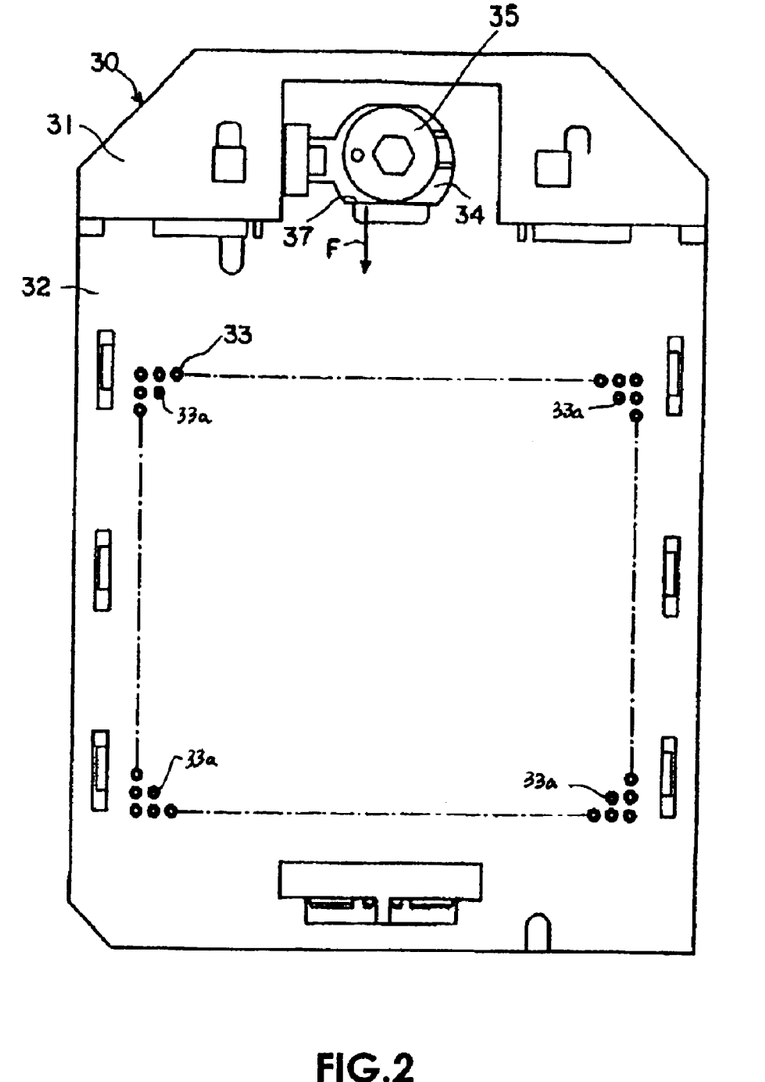
FIG. 2 is a plane view of the PGA package socket in its locking position.
Figure 2A:
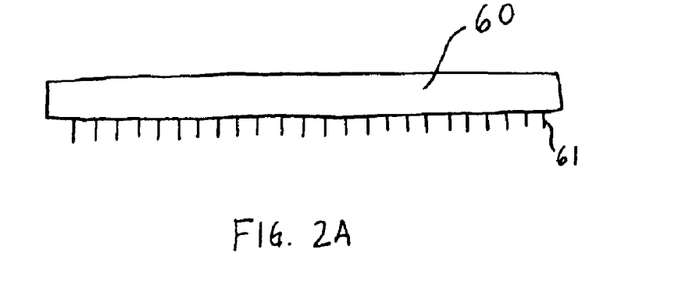
FIG. 2A is a side view of a pin grid array package.

Referring to FIGS. 1 and 2, a pin grid array package socket 30 comprises a rectangular base housing 31 and a slide plate 32 lying on the base housing 31. The base housing 31 has a plurality of terminals 33a arranged in the form of a grid whereas the slide plate 32 has a corresponding plurality of through holes 33 made in the form of a grid. The slide plate 32 is laid on the base housing 31, permitting the lead pins 61 of a PGA package 60 to be inserted in the through holes 33 when the slide plate 32 remains in the first or unlocking position. When the slide plate 32 is moved to the second or locking position, the lead pins of the PGA package are put in contact with the terminals mounted in the base housing 31. Thus, electrical connections are made between the lead pins of the PGA package and the terminals of the base housing 31, and at the same time, the lead pins and the terminals are fastened together. The slide plate 32 has a positioning, or cam, hole 34 made therein, and a cam member 35 is fitted in the cam hole 34.

Figure 4:
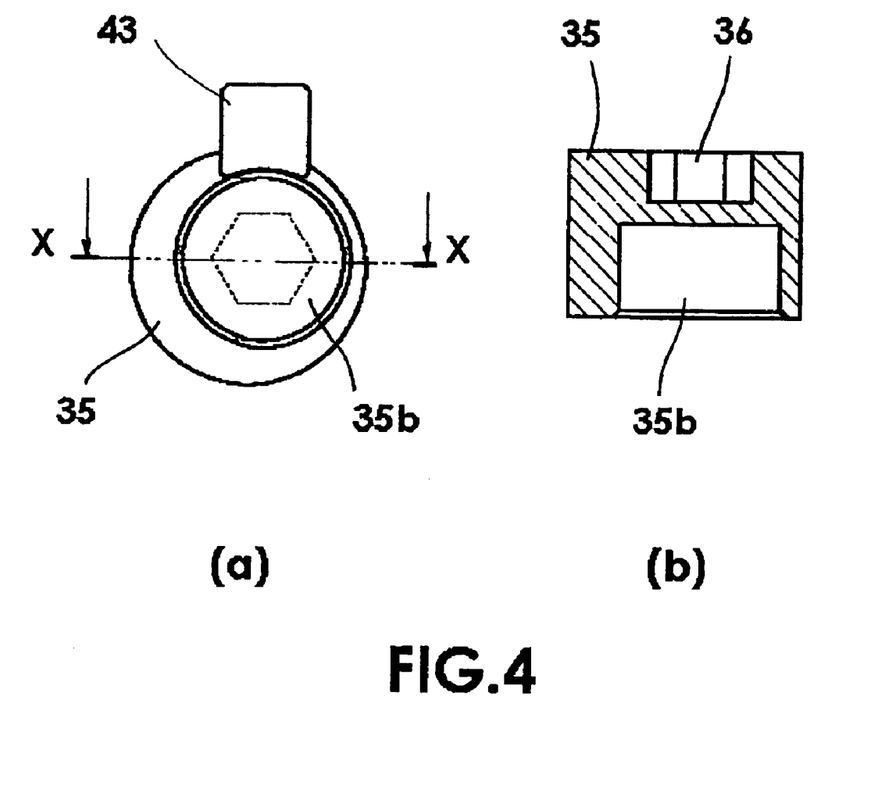
Figure 5:
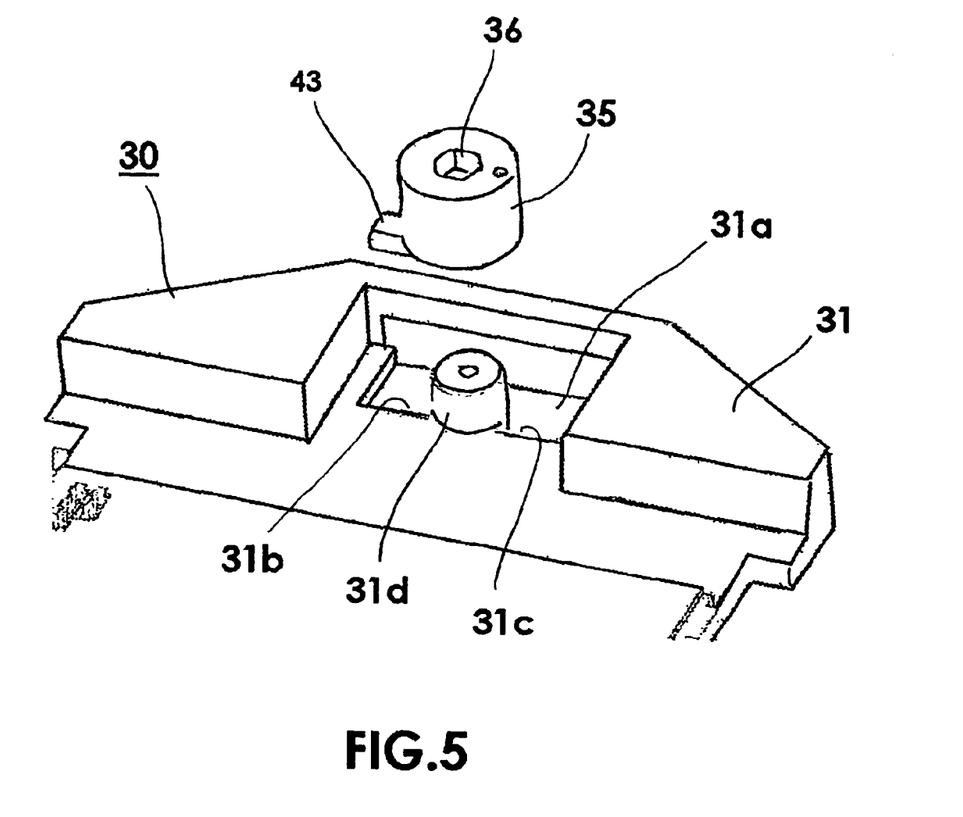
FIG. 5 is an partial enlarged isometric view of base housing showing the relation of a pivot axle 31d, recess 31a and cam member 35.

As shown in FIG. 4(a)(b) and FIG. 5, the cam member 35 has a bearing hole 35b for slipping on a pivot axle 31d of the base housing 31, a hexagonal recess 36 made in its head and a radial protrusion 43 made in its bottom.

As shown in FIG. 5, a recess 31a is formed and includes the pivot axle 31d. There are two inner walls 31b, 31c adjoining the pivot axle 31d. As the radial protrusion 43 of the cam member 35 is plunged into the recess 31a, the travel of the radial protrusion 43 is limited by the inner walls 31b,31c. The cam member 35 therefore can be rotated 180 degrees clockwise or counterclockwise (as indicated by double-headed arrow E of FIG. 1).

Figure 6:
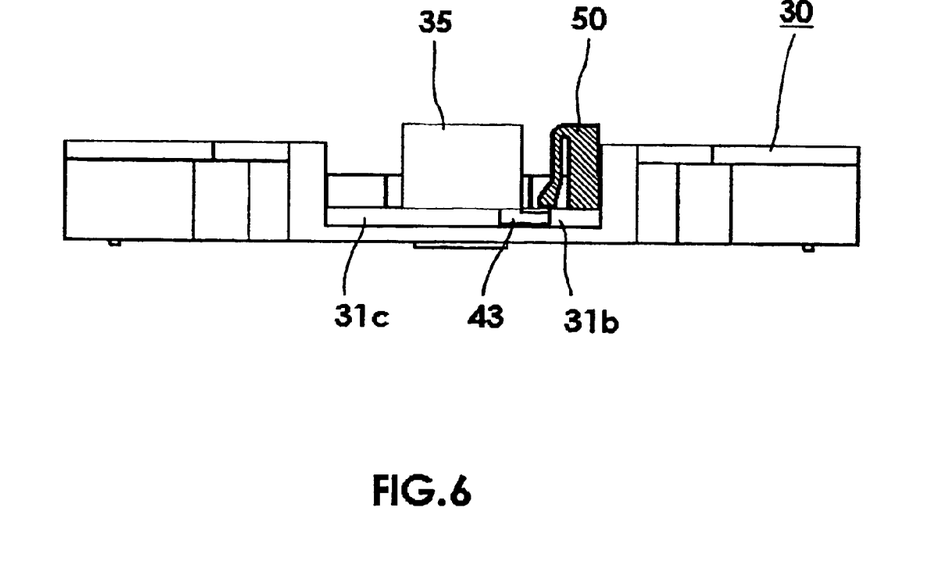
FIG. 6 is a partial cutaway side plan view of the PGA socket.

As shown in FIG. 1, the radial protrusion 43 is in the unlocked position. The cam retainer 50, which may be a separate component or integral with the slide plate 32, overlaps with the radial protrusion 43 to prevent it from coming out. FIG. 6 shows the cross-sectional view of the cam retainer 50. A hexagonal socket wrench is inserted in the hexagonal recess 36 of the head of the cam member 35 to be rotated clockwise. Then, the circumference 40 of the cam member 35 pushes the counter surface 32a of the slide plate 32 in the direction indicated by the arrow F (see FIG. 2) until the cam member 35 has been locked as later described. The cam member 35 cannot be loosened unless the hexagonal socket wrench is inserted in the hexagonal recess of the cam member 35 to be rotated counterclockwise.

Figure 3:
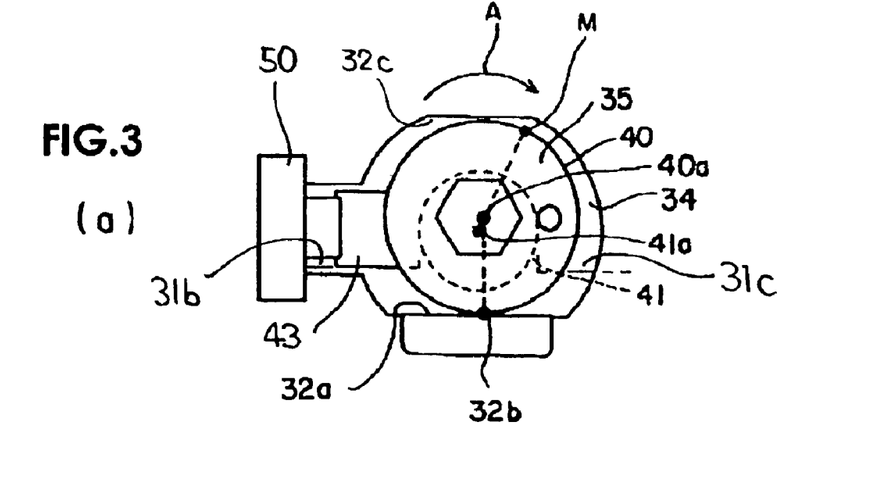

Referring to FIG. 3(a), the outer circumference 40 of the cam member 35 is circular, and the pivot axle 41 under the cam member 35 has its center 41a offset from the center 40a of the outer circumference 40 of the cam member 35. In this particular embodiment the cam member 35 must be rotated 180 degrees from the unlocking position (see FIG. 3(a) and FIG. 1) to the locking position (see FIG. 3(b) and FIG. 2). As shown in FIG. 3(a), the center 41a of the pivot axle 41 is positioned somewhat (more than 3 to 5 degrees) clockwise ahead of the line extending from the center 40a of the outer circumference 40 to the point 32b at which the outer circumference 40 of the cam member 35 is put in contact with the counter surface 32a of the slide plate 32.

The pushing force M, which is the longest vector, originates from the center 41a of the pivot axle 41 is directed from the center 41a to the outer circumference 40 of the cam member 35 via the center 40a of the outer circumference 40. The cam member 35 is rotated 180 degrees to reach the locking position (see FIG. 3(b)), and then, the radial protrusion 43 of the cam member 35 abuts on the inner wall 31c. In this position, the longest vector M have turned beyond the point of contact 32b where the outer circumference 40 of the cam member 35 is put in contact with the counter surface 32a.

As described above, when a PGA package is mounted to the socket 30, the cam member 35 is subjected to the kickback force Y from the lead pins of the PGA package. The point of the vector M which is directed from the center 41a of the pivot axle 41 to the center 40a of the outer circumference 40 is so displaced along the counter surface 32a that the kickback force Y may apply a rotary force (moment) to make the cam member 35 turn clockwise toward the locking position, which is opposite to the counterclockwise turning toward the unlocking position. Thus, there is no fear of allowing the PGA package to be loosely applied to the socket 30. Also, advantageously the arrangement permits use of a circular cam member 35, thus assuring that no gap appears between one side of the cam hole 34 and the outer circumference 40 of the cam member 35 except the manufacturing tolerance, and that no adverse effect is caused on the force-free insertion of lead pins in applying a PGA package to the socket.

As may be understood from the above, a PGA package socket is so designed according to the present invention that upon the slide plate being put in its locking position for fastening a PGA package to the socket the longest vector of the circular cam member runs beyond the point of contact at which the cam member is put in contact with the slide plate, thereby allowing the kickback to push the cam member in the direction opposite to the direction in which the cam member turns toward unlocking position.

While a preferred embodiment of the present invention is shown and described, it is envisioned that those skilled in the art may devise various modifications of the present invention without departing from the spirit and scope of the appended claims.

It will be understood that the invention may be embodied in other specific forms without departing from the spirit thereof. The present examples and embodiments, therefore, are to be considered in all respects as illustrative and not restrictive, and the invention is not to be limited to the details given herein.

What is claimed is:

1. A pin grid array package socket for receiving a pin grid array package having a plurality of lead pins, the pin grid array package socket comprising:

a base housing having a positioning hole and a plurality of terminals arranged in the form of a grid; and a slide plate having a plurality of through holes made in the form of a grid corresponding to the plurality of terminals, the slide plate being laid on the base housing, and being movable between a first position in which the lead pins are permitted to be inserted in the base housing and a second position in which the lead pins are put in contact with the terminals mounted in the base housing, characterized in that the base housing has a cam member rotatably fitted in the positioning hole such that rotation of the cam member allows an outer periphery of the cam member to engage a counter surface of the positioning hole, and wherein a pushing force directed to the counter surface is directed at a position offset from the counter surface such that a kickback force will not move the slide plate from the second position to the first position.

2. The pin grid array package socket according to claim 1 wherein the outer periphery of the cam member is circular.

3. The pin grid array package socket according to claim 1 wherein the cam member includes a radial protrusion to limit the rotation of the cam member.

4. The pin grid array package socket according to claim 1, wherein the base housing includes a recess for receiving the cam member.

5. The pin grid array package socket according to claim 4, wherein the recess includes at least one inner wall, the inner wall acting to limit the travel of the cam member.

6. The pin grid array package socket according to claim 1, wherein the cain member is retained within the positioning hole by a cam retainer.

7. The pin grid package socket according to claim 6, wherein the cam retainer is integral with the slide plate.

8. The pin grid package socket according to claim 1, wherein the cam member rotates around a pivot axle.

9. The pin grid package socket according to claim 8, wherein a center point of the pivot axle is offset from a center of an outer circumference of the cam member.

10. The pin grid package socket according to claim 1, wherein the cam member includes a recess for receiving a tool to rotate the cam member between the first position and the second position.

11. The pin grid package socket according to claim 10, wherein the cam member recess is hexagonal.

* * * * *